(12) United States Patent
Kousai

(10) Patent No.: US 7,705,667 B2
(45) Date of Patent: Apr. 27, 2010

(54) FILTER ADJUSTING CIRCUIT

(75) Inventor: Shouhei Kousai, Pasadena, CA (US)

(73) Assignee: Kabushiki Kaisha Toshiba, Tokyo (JP)

( * ) Notice: Subject to any disclaimer, the term of this patent is extended or adjusted under 35 U.S.C. 154(b) by 14 days.

(21) Appl. No.: 12/246,551

(22) Filed: Oct. 7, 2008

(65) Prior Publication Data

US 2009/0108927 A1    Apr. 30, 2009

(30) Foreign Application Priority Data

Oct. 10, 2007    (JP) ............... 2007-264042

(51) Int. Cl.
*H03B 1/00*    (2006.01)
(52) U.S. Cl. .................................... 327/553
(58) Field of Classification Search .......... 327/551–554
See application file for complete search history.

(56) References Cited

U.S. PATENT DOCUMENTS

| | | | | |
|---|---|---|---|---|
| 6,069,505 A | * | 5/2000 | Babanezhad | 327/156 |
| 6,452,443 B1 | * | 9/2002 | Thompson et al. | 327/553 |
| 6,856,181 B1 | * | 2/2005 | Yahiaoui | 327/156 |
| 7,446,600 B2 | * | 11/2008 | Kosai | 327/553 |
| 2007/0229152 A1 | | 10/2007 | Kosai | |

FOREIGN PATENT DOCUMENTS

JP    2003-124784    4/2003

OTHER PUBLICATIONS

Kazuyuki Wada, et al., "Automatic Tuning System for Integrator-Based Continuous-Time Filters", Analog Integrated Circuits and Signal Processing, 16, 225-238 (1998).

* cited by examiner

*Primary Examiner*—Hai L Nguyen
(74) *Attorney, Agent, or Firm*—Oblon, Spivak, McClelland, Maier & Neustadt, L.L.P.

(57) ABSTRACT

A filter adjusting circuit, has: a filter circuit which has a circuit configuration operating as an n-th order filter including n (n≧1) integrators and can switch a connection of the circuit configuration to operate as a circuit equivalent to the n integrators; a signal generating circuit that outputs a first signal having a predetermined reference frequency to the filter circuit, and outputs a second signal having the reference frequency; a phase comparator that compares a phase of a third signal and a phase of the second signal and determines a phase shift between the signals, the third signal being obtained by processing the first signal in the filter circuit and outputted from the filter circuit; and a control circuit controls the filter circuit.

20 Claims, 10 Drawing Sheets

FILTER ADJUSTING CIRCUIT

CROSS-REFERENCE TO RELATED APPLICATION

This application is based upon and claims the benefit of priority from the prior Japanese Patent Application No. 2007-264042, filed on Oct. 10, 2007, the entire contents of which are incorporated herein by reference.

BACKGROUND OF THE INVENTION

1. Field of the Invention

The present invention relates to a filter adjusting circuit which adjusts the characteristics of a filter and is provided for an active filter.

2. Background Art

In recent years, active filters working on wider frequency bands have been demanded. In active filters for wide frequency bands, however, it is difficult to achieve high quality factors (Q factors) as designed without variations.

Q factors fluctuate due to variations in passive elements such as R, C and L and also nonideal effects of amplifiers in active filters. Although an ideal amplifier has an infinite gain and band, gains and bands are finite in actual amplifiers.

For example, a filter adjusting circuit of the prior art includes a filter where a filter input and a reference clock are switched and inputted and a phase comparator circuit which compares the output of the filter and the phase of the reference clock.

The filter adjusting circuit configured thus adjusts the cutoff frequency of the filter (for example, see Japanese Patent Laid-Open No. 2003-124784).

However, the prior art only discloses a method of adjusting the cutoff frequency of a gm-C filter and does not disclose any specific circuit configurations for adjusting the Q factor of an active filter.

In other words, the Q factor cannot be automatically adjusted in the prior art, for example, when the Q factor varies with manufacturing conditions and the like or when the Q factor fluctuates due to a parasitic effect or a nonideal effect of an amplifier.

As described above, in the filter adjusting circuit of the prior art, it is difficult to design the Q factor of the filter to a desired value.

SUMMARY OF THE INVENTION

According to one aspect of the present invention, there is provided: a filter adjusting circuit, comprising:

a filter circuit which has a circuit configuration operating as an n-th order filter including n ($n \geq 1$) integrators and can switch a connection of the circuit configuration to operate as a circuit equivalent to the n integrators;

a signal generating circuit that outputs a first signal having a predetermined reference frequency to the filter circuit, and outputs a second signal having the reference frequency;

a phase comparator that compares a phase of a third signal and a phase of the second signal and determines a phase shift between the signals, the third signal being obtained by processing the first signal in the filter circuit and outputted from the filter circuit; and a control circuit that switches, in an adjustment mode for adjusting characteristics of the filter circuit, the connection of the circuit configuration to operate the filter circuit as a circuit equivalent to the integrators and adjusts the integrators composing the filter based on a determination result of the phase comparator such that a phase rotation of the first signal is 90° in each of the integrators, and switches, in a normal mode for normally operating the filter circuit after the adjustment mode, the connection of the circuit configuration in a state in which the phase rotation of the first signal is 90° in each of the integrators and controls the filter circuit to operate the filter circuit as the filter.

DETAILED DESCRIPTION

Embodiments to which the present invention is applied will now be described in accordance with the accompanying drawings.

First Embodiment

Figure 1:
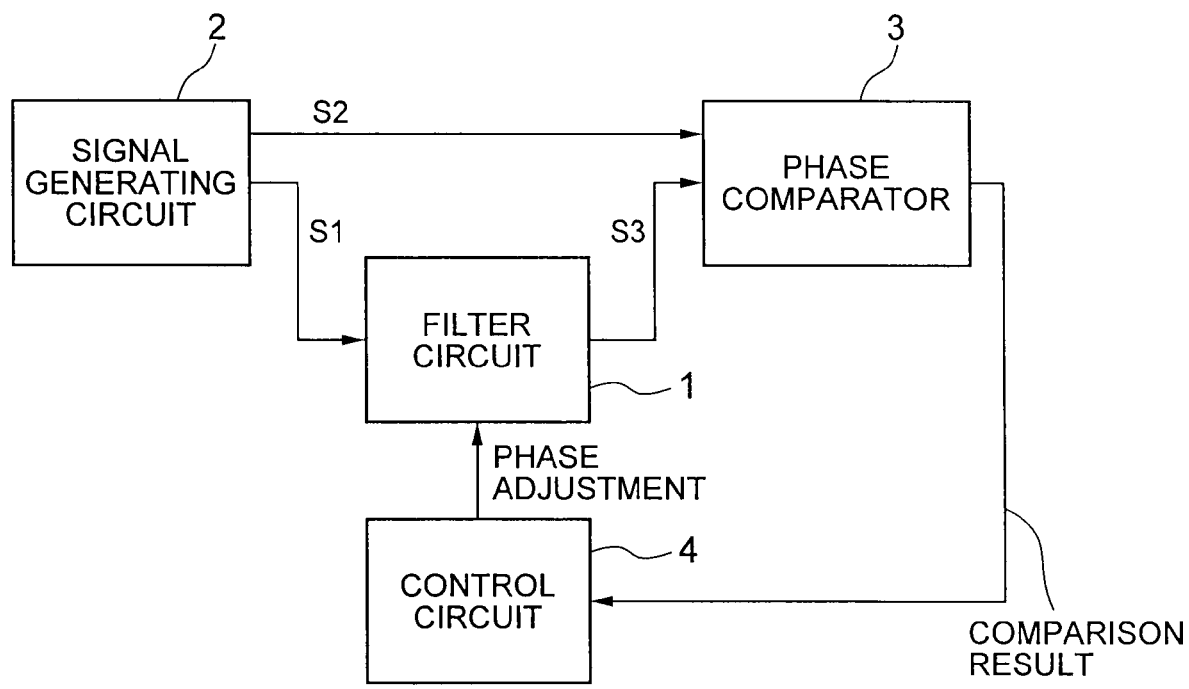
FIG. 1 is a circuit diagram showing the main configuration of a filter adjusting circuit 100 according to a first embodiment which is an aspect of the present invention.

FIG. 1 is a circuit diagram showing the main configuration of a filter adjusting circuit 100 according to a first embodiment which is an aspect of the present invention.

As shown in FIG. 1, the filter adjusting circuit 100 includes a filter circuit 1, a signal generating circuit 2, a phase comparator 3, and a control circuit 4.

The filter circuit 1 has a circuit configuration operating as an n-th order filter including n (n≧1) integrators. The filter circuit 1 switches the connection of the circuit configuration and can operate as a circuit equivalent to the integrators composing the filter. The circuit equivalent to the integrators also includes, for example, an integrator having a resistor connected between the output of the integrator and an output terminal.

The signal generating circuit 2 outputs a first signal S1 having a predetermined reference frequency to the filter circuit 1 and outputs a second signal S2 having the reference frequency. The reference frequency is, for example, the maximum pole frequency of the filter circuit 1. For example, the second signal S2 is designed to have a phase delay of 90 n° (90°×the order of n) from the first signal S1.

The phase comparator 3 compares a phase P2 of the second signal and a phase P3 of a third signal S3 which is obtained by processing the first signal S1 in the filter circuit 1 and is outputted from the filter circuit 1, and determines a phase delay between these signals. Moreover, the phase comparator 3 outputs the determination result to the control circuit 4.

The control circuit 4 controls the connection of the circuit configuration of the filter circuit 1 and controls a phase rotation in the filter circuit 1 based on the determination result of the phase comparator 3.

Figure 2:
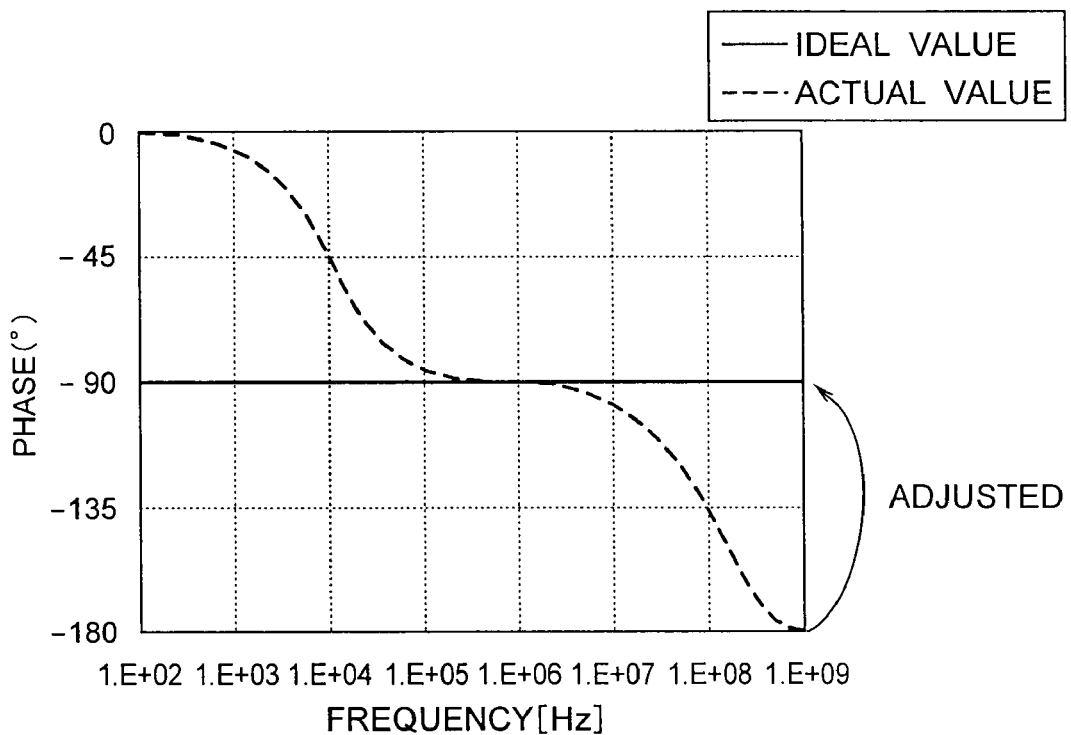
FIG. 2 illustrates an example of a frequency characteristic (transfer function) of the gain of a first-order filter.
Figure 3:
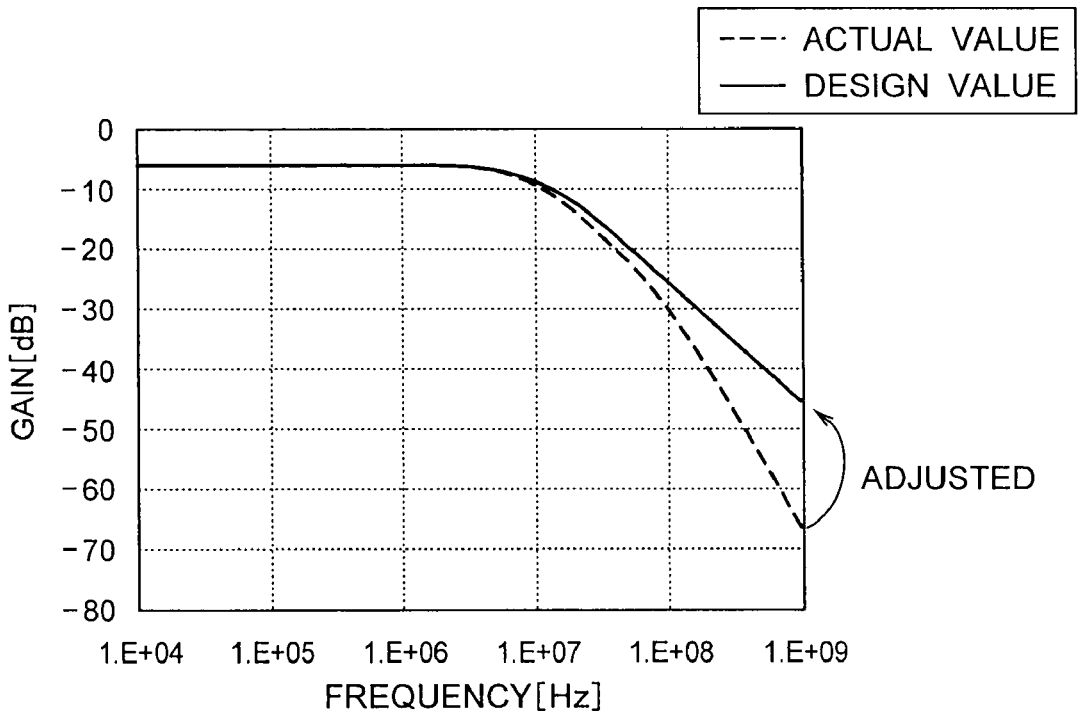
FIG. 3 illustrates an example of a frequency characteristic of a phase rotation in an integrator.

FIG. 2 illustrates an example of a frequency characteristic (transfer function) of the gain of a first-order filter. FIG. 3 illustrates an example of a frequency characteristic of a phase rotation in an integrator.

As shown in FIG. 2, the transfer function of the filter has a deviation between a design value and an actual value at a frequency of, for example, about $1 \times 10^7$ Hz or higher.

Further, as shown in FIG. 3, an ideal phase rotation of the integrator is 90° at each frequency and is kept constant.

On the other hand, the actual phase rotation of the integrator changes, for example, by 90° or larger at a frequency of about $1 \times 10^7$ Hz or higher and is deviated from the ideal phase rotation of the integrator.

In this case, in order to adjust the transfer function of the filter to an ideal value (design value), the phase rotation of each of the integrators composing the filter is preferably adjusted to 90°.

Particularly by adjusting the phase rotation of the integrator at the maximum pole frequency of the filter to 90°, the Q factor can be adjusted to an ideal value.

In the case where an n-th order filter is made up of n integrators connected in series, the phase rotation of the filter is adjusted to 90°×the number of integrators (the order of the filter) at the maximum pole frequency of the filter. It is thus possible to adjust the phase rotation of each integrator to 90°. In other words, the Q factor of the filter can be adjusted to the ideal value.

The following will describe an example of a filter circuit having a circuit configuration for adjusting the phase rotation of an integrator to 90°.

The first embodiment will describe, as a simple example, the case where the filter circuit 1 of FIG. 1 is made up of a single integrator, that is, the case where the filter circuit 1 is a first-order filter.

Figure 4:
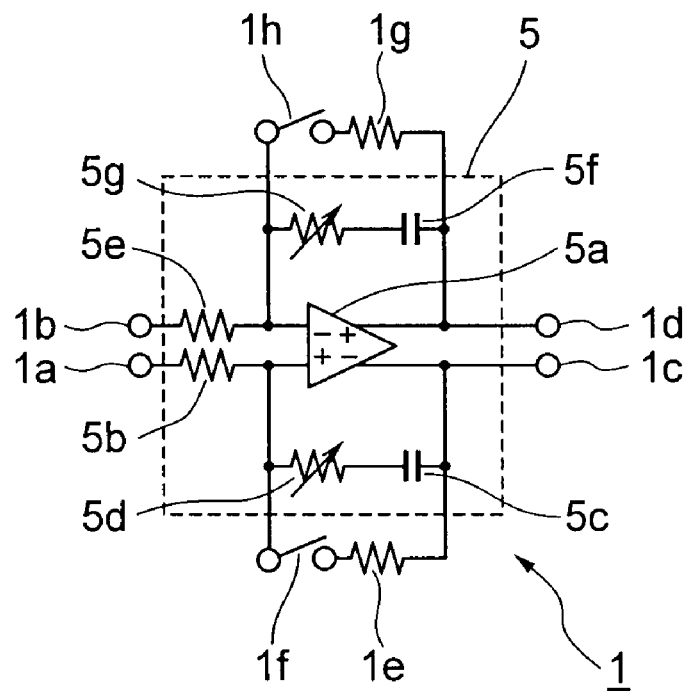
FIG. 4 is a circuit diagram showing an example of a main configuration when the filter circuit 1 of FIG. 1 is a first-order filter.
Figure 5:
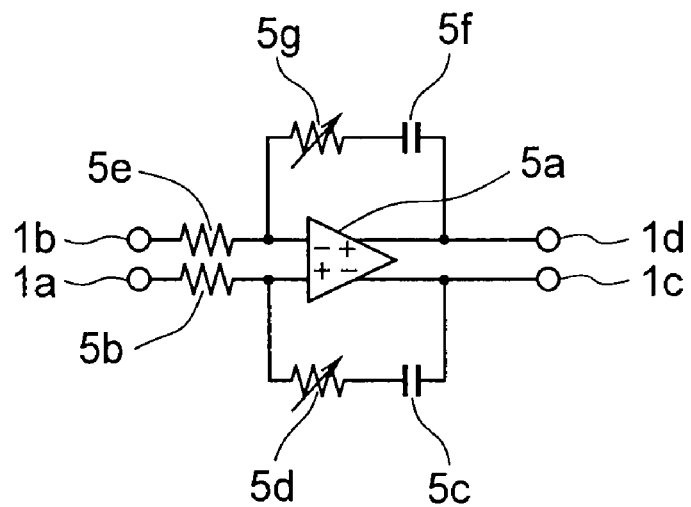
FIG. 5 is a circuit diagram showing an equivalent circuit of the filter circuit 1 when the circuit configuration of the filter circuit 1 of FIG. 4 is switched to operate as an integrator.

FIG. 4 is a circuit diagram showing an example of a main configuration when the filter circuit 1 of FIG. 1 is a first-order filter. FIG. 5 is a circuit diagram showing an equivalent circuit of the filter circuit 1 when the circuit configuration of the filter circuit 1 of FIG. 4 is switched to operate as an integrator.

As shown in FIG. 4, the filter circuit 1 includes a first input terminal 1a, a second input terminal 1b, a first output terminal 1c, a second output terminal 1d, and an integrator 5.

The first and second input terminals 1a and 1b are fed with, as differential signals, signals to be filtered or the first signal S1 having been outputted from the signal generating circuit 2.

From the first and second output terminals 1c and 1d, filtered signals are outputted or the third signal S3 is outputted as differential signals.

The integrator 5 includes an amplifier 5a, a first resistor 5b, a first capacitor 5c, a first variable resistor 5d, a second resistor 5e, a second capacitor 5f, and a second variable resistor 5g.

The amplifier 5a has differential inputs and differential outputs. The differential outputs of the amplifier 5a are connected to the first output terminal 1c and the second output terminal 1d.

The first resistor 5b is connected between the non-inverting input terminal of the amplifier 5a and the first input terminal 1a. The first resistor 5b is fed with a signal through the first input terminal 1a.

The first capacitor 5c is connected between the non-inverting input terminal and the inverting output terminal of the amplifier 5a.

The first variable resistor 5d is connected in series with the first capacitor 5c between the non-inverting input terminal and the inverting output terminal of the amplifier 5a.

The second resistor 5e is connected between the inverting input terminal of the amplifier 5a and the second input terminal 1b. The second resistor 5e is fed with the inverted signal of the signal inputted to the first resistor through the first input terminal 1a.

The resistance value of the first resistor 5b and the resistance value of the second resistor 5e are designed to be equal to each other.

The second capacitor 5f is connected between the inverting input terminal and the non-inverting output terminal of the amplifier 5a.

The capacitance value of the first capacitor 5c and the capacitance value of the second capacitor 5f are designed to be equal to each other.

The second variable resistor 5g is connected in series with the second capacitor 5f between the inverting input terminal and the non-inverting output terminal of the amplifier 5a.

As shown in FIG. 4, the filter circuit 1 further includes a third resistor 1e, a first switch element 1f, a fourth resistor 1g, and a second switch element 1h.

The third resistor 1e is connected in parallel with the first capacitor 5c and the first variable resistor 5d between the non-inverting input terminal and the inverting output terminal of the amplifier 5a.

The first switch element if is connected in series with the third resistor 1e between the non-inverting input terminal and the inverting output terminal of the amplifier 5a.

The fourth resistor 1g is connected in parallel with the second capacitor 5f and the second variable resistor 5g between the inverting input terminal and the non-inverting output terminal of the amplifier 5a.

The second switch element 1h is connected in series with the fourth resistor 11g between the inverting input terminal and the non-inverting output terminal of the amplifier 5a.

The first to fourth resistors 5b, 5e, 1e and 1g and the first and second capacitors 5c and 5f are set according to a target cutoff frequency and a target Q factor of the filter circuit 1. Further, the Q factor is adjusted by adjusting the resistance values of the first and second variable resistors.

The phase rotation of the integrator 5 is controlled by adjusting the resistance values of the first and second variable resistors 5d and 5g through the control circuit 4.

The first switch element 1f and the second switch element 1h are made up of, for example, MOS transistors.

The circuit configuration of the filter circuit 1 is switched by turning off the first and second switch elements 1f and 1h. Thus the filter circuit 1 operates as a first-order integrator (FIG. 5).

The following will describe a controlling operation performed on the filter circuit 1 by the control circuit 4 of the filter adjusting circuit 100 configured thus. In the following example, the phase of the second signal S2 is delayed from the phase of the first signal S1 by 90°. The control circuit 4 operates in two modes of adjustment mode M1 for adjusting the characteristics of the filter circuit 1 and normal mode M2 for normally operating the filter circuit after adjustment mode M1. The frequencies of the first and second signals S1 and S2 are set at the pole frequency of the filter circuit 1.

First, the operations of the control circuit 4 in adjustment mode M1 will be described below.

In adjustment mode M1, the control circuit 4 switches the connection of the circuit configuration of the filter circuit 1 to operate the filter circuit 1 as a circuit equivalent to the integrator. In other words, the control circuit 4 turns off the first switch element 1f and the second switch element 1h and operates the filter circuit 1 as a circuit equivalent to the integrator 5 composing the filter, as shown in FIG. 5.

When the phase comparator 3 is fed with the third signal S3 outputted from the filter circuit 1 having operated as a circuit equivalent to the integrator 5, the phase comparator 3 determines whether or not the second signal S2 and the third signal S3 are in phase with each other, and then the phase comparator 3 outputs the determination result to the control circuit 4.

When receiving a determination result of a phase shift, the control circuit 4 adjusts the resistance values of the first and second variable resistors 5d and 5g of the integrator 5, which composes the filter, based on the determination result such that the phase rotation of the integrator 5 is 90°.

As described above, the phase rotation of each integrator is adjusted to 90° at the pole frequency, so that the Q factor is adjusted to the ideal value.

The operations of the control circuit 4 in normal mode M2 will be described below.

The control circuit 4 switches the connection of the circuit configuration in a state in which the phase rotation of the first signal S1 is adjusted to 90° in the single integrator 5, so that the filter circuit 1 is controlled to operate as a filter.

In other words, the control circuit 4 turns on the first switch element if and the second switch element 1h and controls the filter circuit 1 such that the filter circuit 1 operates as a filter. The resistance values of the first and second variable resistors 5d and 5g of the integrator 5 at this point are kept at a value having been adjusted in adjustment mode M1. In other words, the phase rotation of the integrator 5 at the pole frequency is set at 90°.

In normal operation mode M2, the differential signals to be filtered are inputted to the filter circuit 1 through the first and second input terminals 1a and 1b, and then the filter circuit 1 outputs the filtered differential signals through the first and second output terminals 1c and 1d.

As described above, in adjustment mode M1, the Q factor of the filter circuit 1 is adjusted to the ideal value. Thus the filter circuit 1 can perform desired filtering as designed.

As described above, the filter adjusting circuit 100 of the present embodiment can automatically adjust the characteristics of the filter circuit 1 operating as a first-order filter.

Second Embodiment

The first embodiment described a filter adjusting circuit and an example of the configuration of a first-order filter circuit applied to the filter adjusting circuit.

The present embodiment will describe, as another example of the filter circuit, the case where the filter circuit 1 of FIG. 1 is made up of two integrators, in other words, the case where the filter circuit 1 is a second-order filter.

Figure 6:
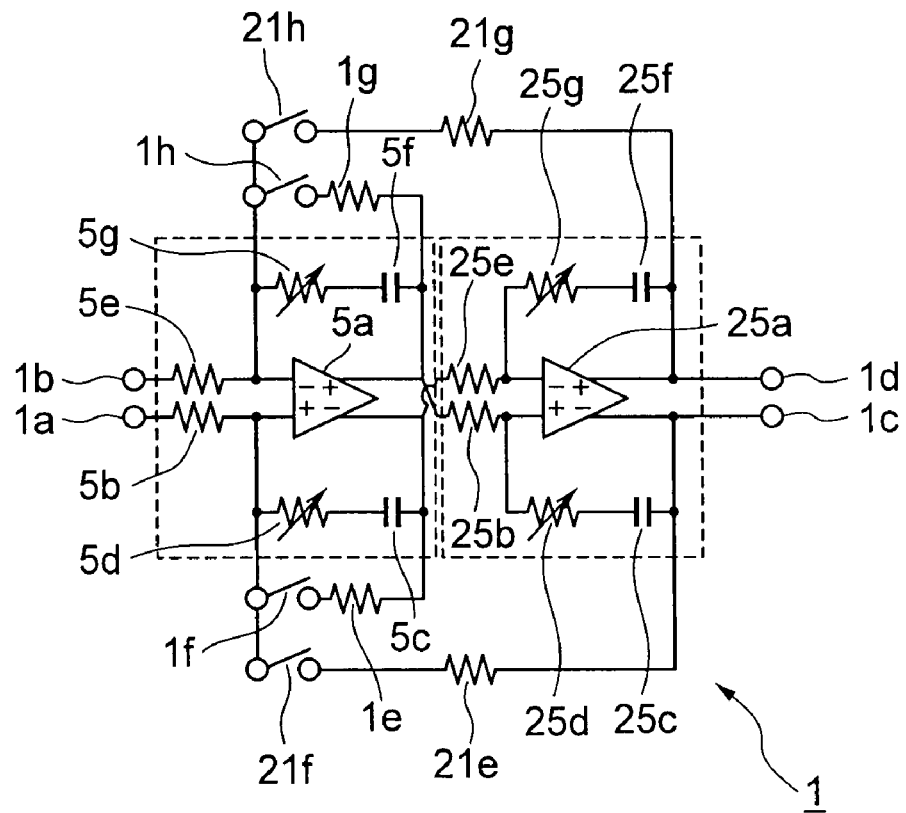
FIG. 6 is a circuit diagram showing an example of a main configuration when the filter circuit 1 of FIG. 1 is a second-order filter.
Figure 7:
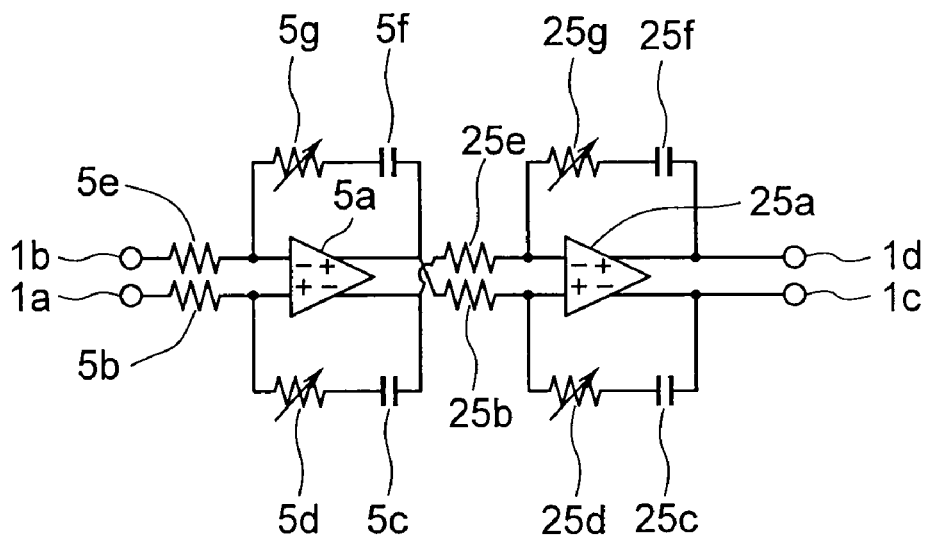
FIG. 7 is a circuit diagram showing an equivalent circuit of the filter circuit 1 when the circuit configuration of the filter circuit 1 in FIG. 6 is switched to operate as an integrator.

FIG. 6 is a circuit diagram showing an example of a main configuration when the filter circuit 1 of FIG. 1 is a second-order filter. FIG. 7 is a circuit diagram showing an equivalent circuit of the filter circuit 1 when the circuit configuration of the filter circuit 1 in FIG. 6 is switched to operate as an integrator.

Configurations indicated by the same reference numerals as in the first embodiment are similar to the configurations of the first embodiment. Further, the filter circuit 1 of the second embodiment is applied like the filter circuit 1 of the first embodiment to the filter adjusting circuit 100 of FIG. 1.

As shown in FIG. 6, the filter circuit 1 further includes an integrator 25, a third resistor 21e, a first switch element 21f, a fourth resistor 21g, and a second switch element 21h unlike the first embodiment.

The integrator 25 configured like the integrator 5 includes an amplifier 25a, a first resistor 25b, a first capacitor 25c, a first variable resistor 25d, a second resistor 25e, a second capacitor 25f, and a second variable resistor 25g.

The amplifier 25a is similar in configuration to an amplifier 5a. The differential outputs of the amplifier 25a are connected to a first output terminal 1c and a second output terminal 1d.

The first resistor 25b is connected between the non-inverting input terminal of the amplifier 25a and the non-inverting output terminal of the amplifier 5a.

The first capacitor 25c is connected between the non-inverting input terminal and the inverting output terminal of the amplifier 25a.

The first variable resistor 25d is connected in series with the first capacitor 25c between the non-inverting input terminal and the inverting output terminal of the amplifier 25a.

The second resistor 25e is connected between the inverting input terminal of the amplifier 25a and the inverting output terminal of the amplifier 5a.

The resistance value of the first resistor 25b and the resistance value of the second resistor 25e are designed to be equal to each other.

The second capacitor 25f is connected between the inverting input terminal and the non-inverting output terminal of the amplifier 25a.

The capacitance value of the first capacitor 25c and the capacitance value of the second capacitor 25f are designed to be equal to each other.

The second variable resistor 25g is connected in series with the second capacitor 25f between the inverting input terminal and the non-inverting output terminal of the amplifier 25a.

The third resistor 21e is connected between the non-inverting input terminal of the amplifier 5a and the inverting output terminal of the amplifier 25a.

The first switch element 21f is connected in series with the third resistor 21e between the non-inverting input terminal of the amplifier 5a and the inverting output terminal of the amplifier 25a.

The fourth resistor 21g is connected between the inverting input terminal of the amplifier 5a and the non-inverting output terminal of the amplifier 25a.

The second switch element 21h is connected in series with the fourth resistor 21g between the inverting input terminal of the amplifier 5a and the non-inverting output terminal of the amplifier 25a.

The first to fourth resistors 5b, 5e, 1e, 1g, 25b, 25e, 21e and 21g and the first and second capacitors 5c, 5f, 25c and 25f are set according to a target cutoff frequency and a target Q factor of the filter circuit 1.

The phase rotation of the integrator 25 is controlled by adjusting the resistance values of the first and second variable resistors 25d and 25g through a control circuit 4. Further, the Q factor is adjusted by adjusting the resistance values of the first and second variable resistors.

The first switch element 21f and the second switch element 21h are made up of, for example, MOS transistors.

The circuit configuration of the filter circuit 1 is switched by turning off the first and second switch elements 1f, 1h, 25f and 25h. Thus the filter circuit 1 operates as a second-order integrator (FIG. 7).

The following will describe an operation for controlling the filter circuit 1 configured thus. In the following explanation, the phase of a second signal S2 is delayed from the phase of a first signal S1 by 180° (90°×the order of 2). As in the first embodiment, the frequencies of the first and second signals S1 and S2 are set at the pole frequency of the filter circuit 1.

First, the operations of the control circuit 4 in adjustment mode M1 will be described below.

In adjustment mode M1, the control circuit 4 switches the connection of the circuit configuration of the filter circuit 1 to operate the filter circuit 1 as a circuit equivalent to the integrators. In other words, the control circuit 4 turns off the first switch elements 1f and 21f and the second switch elements 1h and 21h and operates the filter circuit 1 as a circuit equivalent to the integrators composing a filter, as shown in FIG. 7.

As in the first embodiment, when a phase comparator 3 is fed with a third signal S3 outputted from the filter circuit 1 having operated as a circuit equivalent to the integrators, the phase comparator 3 determines whether or not the second signal S2 and the third signal S3 are in phase with each other, and then the phase comparator 3 outputs the determination result to the control circuit 4.

When receiving a determination result of a phase shift, the control circuit 4 adjusts the resistance values of the first and second variable resistors 5d, 25d, 5g and 25g of the integrators 5 and 25, which compose the filter, based on the determination result such that the phase rotation of each of the integrators is 90°.

For example, the control circuit 4 adjusts the resistance values of the first and second variable resistors 5d, 25d, 5g and 25g based on the determination result such that the second signal S2 and the third signal S3 are in phase with each other. At this point, the control circuit 4 adjusts the resistance value of the first variable resistor such that the products of the first capacitors and the first variable resistors are equal between all the integrators 5 and 25. Further, the control circuit 4 adjusts the resistance value of the second variable resistor such that the products of the second capacitors and the second variable resistors are equal between the integrators 5 and 25. Thus the phase rotation of each of the integrators 5 and 25 is adjusted to 90°.

As described above, the phase rotation of each of the integrators is adjusted to 90° at the pole frequency, so that the Q factor is adjusted to an ideal value.

Next, the operations of the control circuit 4 in normal mode M2 will be described.

As in the first embodiment, the control circuit 4 switches the connection of the circuit configuration in a state in which the phase rotation of the first signal S1 is adjusted to 90° in each of the integrators, so that the filter circuit 1 is controlled to operate as a filter.

In other words, the control circuit 4 turns on the first switch elements 1f and 21f and the second switch elements 1h and 21h and controls the filter circuit 1 such that the filter circuit 1 operates as a filter. The resistance values of the first and second variable resistors 5d, 25d, 5g and 25g of the integrators 5 and 25 at this point are kept at the values having been adjusted in adjustment mode M1. In other words, the phase rotations of the integrators 5 and 25 at the pole frequency are set at 90°.

As in the first embodiment, in normal operation mode M2, differential signals to be filtered are inputted to the filter circuit 1 through first and second input terminals 1a and 1b, and then the filter circuit 1 outputs the filtered differential signals through first and second output terminals 1c and 1d.

As described above, in adjustment mode M1, the Q factor of the filter circuit 1 is adjusted to the ideal value. Thus the filter circuit 1 can perform desired filtering as designed.

As described above, the filter adjusting circuit 100 of the present embodiment can automatically adjust the characteristics of the filter circuit 1 operating as a second-order filter.

Third Embodiment

The first and second embodiments described filter adjusting circuits and examples of the configurations of the first and second-order filter circuits applied to the filter adjusting circuits.

The present embodiment will describe, as another example of a filter circuit, the case where the filter circuit 1 of FIG. 1 is made up of five integrators, in other words, the case where the filter circuit 1 is a fifth-order (high-order) filter.

Figure 8:
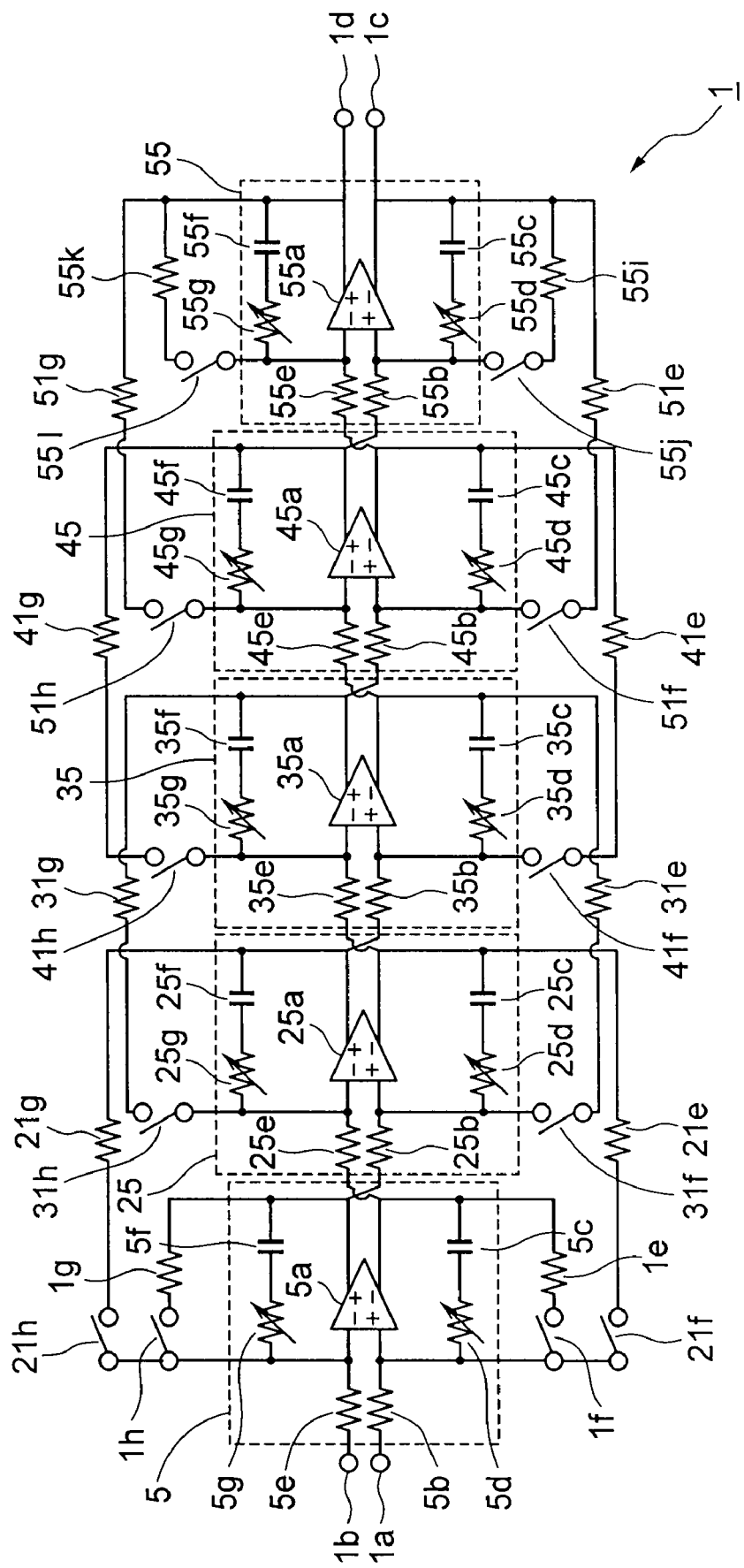
FIG. 8 is a circuit diagram showing an example of a main configuration when the filter circuit 1 of FIG. 1 is a fifth-order filter.
Figure 9:
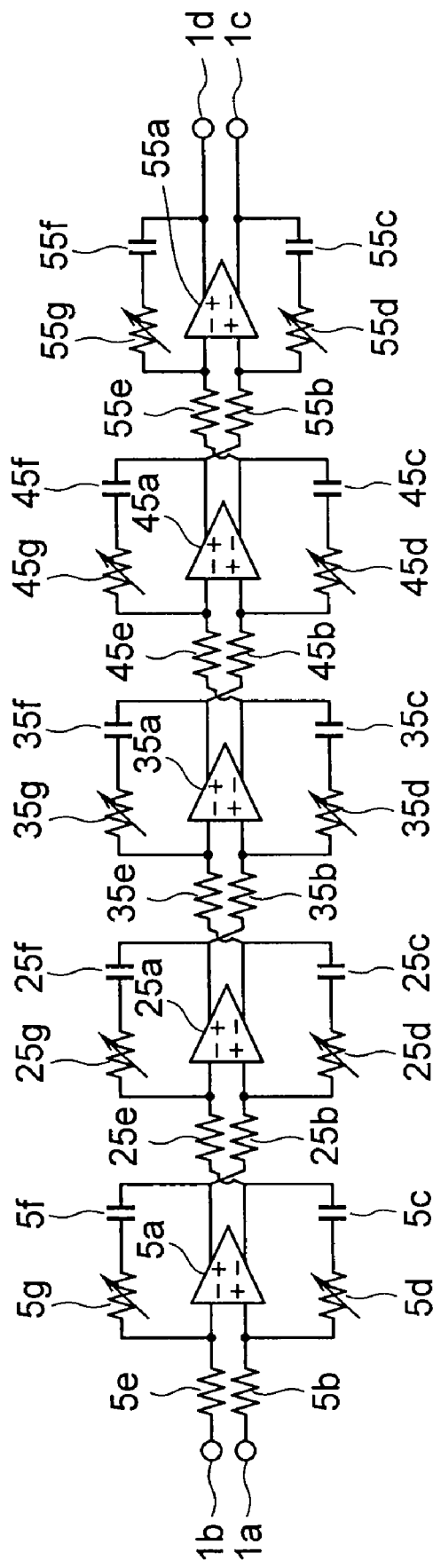
FIG. 9 is a circuit diagram showing an equivalent circuit of the filter circuit 1 when the circuit configuration of the filter circuit 1 in FIG. 8 is switched to operate as an integrator.

FIG. 8 is a circuit diagram showing an example of a main configuration when the filter circuit 1 of FIG. 1 is a fifth-order filter. FIG. 9 is a circuit diagram showing an equivalent circuit of the filter circuit 1 when the circuit configuration of the filter circuit 1 in FIG. 8 is switched to operate as an integrator.

Configurations indicated by the same reference numerals as in the first embodiment are similar to the configurations of the first embodiment. The filter circuit 1 of the third embodiment is applied to, like the filter circuit 1 of the first embodiment, the filter adjusting circuit 100 of FIG. 1.

As shown in FIG. 8, the filter circuit 1 further includes, unlike the second embodiment, integrators 35, 45 and 55, third resistors 31e, 41e and 51e, first switch elements 31f, 41f and 51f, fourth resistors 31g, 41g and 51g, second switch elements 31h, 41h and 51h, a fifth resistor 55i, a sixth resistor 55k, a third switch element 55j, and a fourth switch element 55l.

The integrators 35, 45 and 55 are similar in configuration to the integrators 5 and 25. The integrators 5, 25, 35, 45 and 55 are connected in series and compose a fifth-order integrator.

The integrator 35 includes an amplifier 35a, a first resistor 35b, a first capacitor 35c, a first variable resistor 35d, a second resistor 35e, a second capacitor 35f, and a second variable resistor 35g. The integrator 45 similarly includes an amplifier 45a, a first resistor 45b, a first capacitor 45c, a first variable resistor 45d, a second resistor 45e, a second capacitor 45f, and a second variable resistor 45g. The integrator 55 similarly includes an amplifier 55a, a first resistor 55b, a first capacitor 55c, a first variable resistor 55d, a second resistor 55e, a second capacitor 55f, and a second variable resistor 55g.

As shown in FIG. 8, the configurations of the integrators 35, 45 and 55 are connected in a similar manner to the integrator 25.

The amplifiers 35a, 45a and 55a are similar in configuration to the amplifiers 5a and 25a.

The resistance value of the first resistor 35b and the resistance value of the second resistor 35e are designed to be equal to each other. Further, the resistance value of the first resistor 45b and the resistance value of the second resistor 45e are designed to be equal to each other. Moreover, the resistance value of the first resistor 55b and the resistance value of the second resistor 55e are designed to be equal to each other.

The capacitance value of the first capacitor 35c and the capacitance value of the second capacitor 35f are designed to be equal to each other. Further, the capacitance value of the first capacitor 45c and the capacitance value of the second capacitor 45f are designed to be equal to each other. Moreover, the capacitance value of the first capacitor 55c and the capacitance value of the second capacitor 55f are designed to be equal to each other.

The third resistor 31e is connected between the non-inverting input terminal of the amplifier 25a and the inverting output terminal of the amplifier 35a. The third resistor 41e is similarly connected between the non-inverting input terminal of the amplifier 35a and the inverting output terminal of the amplifier 45a. The third resistor 51e is similarly connected between the non-inverting input terminal of the amplifier 45a and the inverting output terminal of the amplifier 55a.

The first switch element 31f is connected in series with the third resistor 31e between the non-inverting input terminal of the amplifier 25a and the inverting output terminal of the amplifier 35a. The first switch element 41f is similarly connected in series with the third resistor 41e between the non-inverting input terminal of the amplifier 35a and the inverting output terminal of the amplifier 45a. The first switch element 51f is similarly connected in series with the third resistor 51e between the non-inverting input terminal of the amplifier 45a and the inverting output terminal of the amplifier 55a.

The fourth resistor 31g is connected between the inverting input terminal of the amplifier 25a and the non-inverting output terminal of the amplifier 35a. The fourth resistor 41g is similarly connected between the inverting input terminal of the amplifier 35a and the non-inverting output terminal of the amplifier 45a. The fourth resistor 51g is similarly connected between the inverting input terminal of the amplifier 45a and the non-inverting output terminal of the amplifier 55a.

The second switch element 31h is connected in series with the fourth resistor 31g between the inverting input terminal of the amplifier 25a and the non-inverting output terminal of the amplifier 35a. The second switch element 41h is similarly connected in series with the fourth resistor 41g between the inverting input terminal of the amplifier 35a and the non-inverting output terminal of the amplifier 45a. The second switch element 51h is similarly connected in series with the fourth resistor 51g between the inverting input terminal of the amplifier 45a and the non-inverting output terminal of the amplifier 55a.

The fifth resistor 55i is connected in parallel with the first capacitor 55c and the first variable resistor 55d between the non-inverting input terminal of the amplifier 55a and the inverting output terminal of the amplifier 55a.

The sixth resistor 55k is connected in parallel with the second capacitor 55f and the second variable resistor 55g between the inverting input terminal of the amplifier 55a and the non-inverting output terminal of the amplifier 55a.

The third switch element 55j is connected in series with the fifth resistor 55i between the non-inverting input terminal of the amplifier 55a and the inverting output terminal of the amplifier 55a.

The fourth switch element 55l is connected in series with the sixth resistor 55k between the inverting input terminal of the amplifier 55a and the non-inverting output terminal of the amplifier 55a.

The first to fifth resistors and the first and second capacitors are set according to a target cutoff frequency and a target Q factor of the filter circuit 1.

The phase rotation of each of the integrators is controlled by adjusting the resistance values of the first and second variable resistors through a control circuit 4. Further, the Q factor is adjusted by adjusting the resistance values of the first and second variable resistors.

The first switch element and the second switch element are made up of, for example, MOS transistors.

The circuit configuration of the filter circuit 1 is switched by turning off the first and second switch elements and the third switch element. Thus the filter circuit 1 operates as a fifth-order integrator (FIG. 9).

The following will describe an operation for controlling the filter circuit 1 configured thus. In the following explanation, the phase of a second signal S2 is delayed from the phase of a first signal S1 by 450° (90°×the order of 5). As in the first embodiment, the frequencies of the first and second signals S1 and S2 are set at the maximum pole frequency of the filter circuit 1.

First, the operations of the control circuit 4 in adjustment mode M1 will be described below.

In adjustment mode M1, the control circuit 4 switches the connection of the circuit configuration of the filter circuit 1 to operate the filter circuit 1 as a circuit equivalent to the integrators. In other words, the control circuit 4 turns off the first to fourth switch elements and operates the filter circuit 1 as a circuit equivalent to the integrators composing the filter, as shown in FIG. 9.

As in the first embodiment, when a phase comparator 3 is fed with a third signal S3 outputted from the filter circuit 1 having operated as a circuit equivalent to the integrators, the phase comparator 3 determines whether or not the second signal S2 and the third signal S3 are in phase with each other, and then the phase comparator 3 outputs the determination result to the control circuit 4.

When receiving the determination result of a phase shift, the control circuit 4 adjusts the resistance values of the first and second variable resistors based on the determination result such that the phase rotation of each of the integrators is 90°.

For example, the control circuit 4 adjusts the resistance values of the first and second variable resistors based on the determination result such that the second signal S2 and the third signal S3 are in phase with each other. At this point, the control circuit 4 adjusts the resistance value of the first variable resistor such that the products of the first capacitors and the first variable resistors are equal among all the integrators 5, 25, 35, 45 and 55. Further, the control circuit 4 adjusts the resistance value of the second variable resistor such that the products of the second capacitors and the second variable resistors are equal among all the integrators 5, 25, 35, 45 and 55. Thus the phase rotation of each of the integrators is adjusted to 90°.

As described above, the phase rotation of each of the integrators is adjusted to 90° at the maximum pole frequency, so that the Q factor is adjusted to an ideal value.

Next, the operations of the control circuit 4 in normal mode M2 will be described.

As in the first embodiment, the control circuit 4 switches the connection of the circuit configuration in a state in which the phase rotation of the first signal S1 is adjusted to 90° in each of the integrators, so that the filter circuit 1 is controlled to operate as a filter.

In other words, the control circuit 4 turns on the first to fourth switch elements and controls the filter circuit 1 such that the filter circuit 1 operates as a filter. The resistance values of the first and second variable resistors of the integrators at this point are kept at the values having been adjusted in adjustment mode M1. In other words, the phase rotation of each of the integrators at the maximum pole frequency is set at 90°.

As in the first embodiment, in normal operation mode M2, differential signals to be filtered are inputted to the filter circuit 1 through first and second input terminals 1a and 1b, and then the filter circuit 1 outputs the filtered differential signals through first and second output terminals 1c and 1d.

As described above, in adjustment mode M1, the Q factor of the filter circuit 1 is adjusted to the ideal value. Thus the filter circuit 1 can perform desired filtering as designed.

As described above, the filter adjusting circuit of the present embodiment can automatically adjust the characteristics of a high-order filter circuit.

Fourth Embodiment

The first to third embodiments described examples of the configurations of a filter circuit.

The present embodiment will describe another structural example of a first-order filter circuit applied to the filter adjusting circuit.

Figure 10:
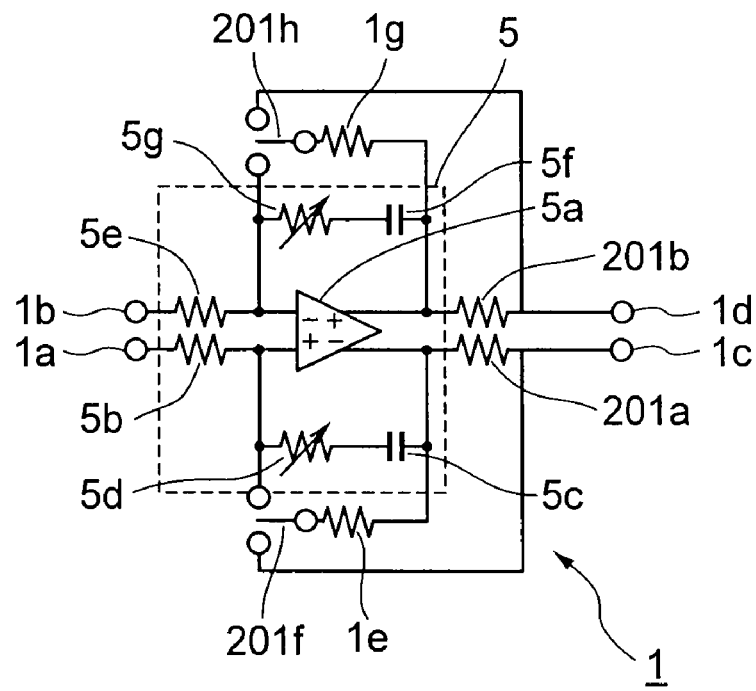
FIG. 10 is a circuit diagram showing another example of a main configuration when the filter circuit 1 of FIG. 1 is a first-order filter.
Figure 11:
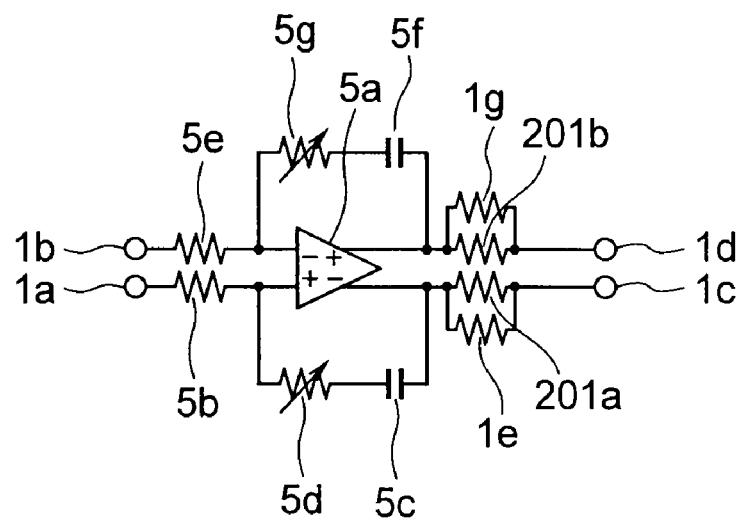
FIG. 11 is a circuit diagram showing an equivalent circuit of the filter circuit 1 when the circuit configuration of the filter circuit 1 of FIG. 10 is switched to operate as an integrator.

FIG. 10 is a circuit diagram showing another example of a main configuration when the filter circuit 1 of FIG. 1 is a first-order filter. FIG. 11 is a circuit diagram showing an equivalent circuit of the filter circuit 1 when the circuit configuration of the filter circuit 1 of FIG. 10 is switched to operate as an integrator.

Configurations indicated by the same reference numerals as in the first embodiment are similar to the configurations of the first embodiment. Further, the filter circuit 1 of the second embodiment is applied to, like the filter circuit 1 of the first embodiment, the filter adjusting circuit 100 of FIG. 1.

As shown in FIG. 10, the filter circuit 1 further includes, unlike the first embodiment, a first output-terminal resistor 201a and a second output-terminal resistor 201b. Moreover, a first switch element 201f and a second switch element 201h have a different connection relationship from the switch elements of the first embodiment. An amplifier 5a is similar in configuration to the amplifier of the first embodiment.

The first output-terminal resistor 201a has one end connected to the inverting output terminal of the amplifier 5a and the other end connected to a first output terminal 1c.

The second output-terminal resistor 201b has one end connected to the non-inverting output terminal of the amplifier 5a and the other end connected to a second output terminal 1d.

The resistance value of the first output-terminal resistor 201a and the resistance value of the second output-terminal resistor 201b are designed to be equal to each other.

The first switch element 201f is connected between the non-inverting input terminal of the amplifier 5a and a third resistor 1e. The first switch element 201f is also connected to the other end of the first output-terminal resistor 201a.

When the filter circuit 1 is operated as a filter, the third resistor 1e is switched to be connected to the non-inverting input terminal of the amplifier 5a by switching the first switch element 201f. When the filter circuit 1 is operated as an integrator, the third resistor 1e is switched to be connected in parallel with the first output-terminal resistor 201a by switching the first switch element 201f.

The second switch element 201h is connected between the inverting input terminal of the amplifier 5a and a fourth resistor 1g. The second switch element 201h is also connected to the other end of the second output-terminal resistor 201b.

When the filter circuit 1 is operated as a filter, the fourth resistor 1g is switched to be connected to the inverting input terminal of the amplifier 5a by switching the second switch element 201h. When the filter circuit 1 is operated as an integrator, the fourth resistor 1g is switched to be connected in parallel with the second output-terminal resistor 201b by switching the second switch element 201h.

The first to fourth resistors, the first and second output-terminal resistors, and first and second capacitors are set according to a target cutoff frequency and a target Q factor of the filter circuit 1.

The phase rotation of an integrator 5 is controlled by adjusting the resistance values of first and second variable resistors through a control circuit 4. Further, the Q factor is adjusted by adjusting the resistance values of the first and second variable resistors.

The first switch element 201f and the second switch element 201h are made up of, for example, MOS transistors.

The circuit configuration of the filter circuit 1 is switched by switching the first and second switch elements 201f and 201h. Thus the filter circuit 1 operates as a first-order integrator (FIG. 11). As shown in FIGS. 10 and 11, the number of resistors driven by the amplifier 5a is the same both in the case where the filter circuit 1 is operated as an integrator and in the case where the filter circuit 1 is operated as a filter.

The following will describe an operation for controlling the filter circuit 1 configured thus. In the following explanation, the phase of a second signal S2 is delayed from the phase of a first signal S1 by 90° (90°×the order of 1). As in the first embodiment, the frequencies of the first and second signals S1 and S2 are set at the pole frequency of the filter circuit 1.

First, the operations of the control circuit 4 in adjustment mode M1 will be described below.

In adjustment mode M1, the control circuit 4 switches the connection of the circuit configuration of the filter circuit 1 to operate the filter circuit 1 as a circuit (in this case, including the first and second output-terminal resistors) equivalent to an integrator.

To be specific, the control circuit 4 switches the first switch element 201f and the second switch element 201h and operates the filter circuit 1 as a circuit equivalent to the integrator composing the filter, as shown in FIG. 11. In other words, the control circuit 4 switches the connection of the circuit configuration such that the resistors 1e and 1g are connected in parallel with the resistors 201a and 201b connected to the output of the integrator 5, the resistors 1e and 1g being used when the filter circuit 1 operates as a filter in normal mode.

As in the first embodiment, when a phase comparator 3 is then fed with a third signal S3 outputted from the filter circuit 1 having operated as a circuit equivalent to an integrator, the phase comparator 3 determines whether or not the second signal S2 and the third signal S3 are in phase with each other, and then the phase comparator 3 outputs the determination result to the control circuit 4.

When receiving a determination result of a phase shift, the control circuit 4 adjusts the resistance values of the first and second variable resistors 5d and 5g of the integrator 5, which composes the filter, based on the determination result such that the phase rotation of the integrator is 90°.

For example, the control circuit 4 adjusts the resistance values of the first and second variable resistors 5d and 5g based on the determination result such that the second signal S2 and the third signal S3 are in phase with each other.

As described above, the phase rotation of the integrator is adjusted to 90° at a pole frequency, so that the Q factor is adjusted to an ideal value.

Next, the operations of the control circuit 4 in normal mode M2 will be described.

As in the first embodiment, the control circuit 4 switches the connection of the circuit configuration in a state in which the phase rotation of the first signal S1 is adjusted to 90° in the integrator, so that the filter circuit 1 is controlled to operate as a filter.

In other words, the control circuit 4 switches the first switch element 201f and the second switch element 201h to control the filter circuit 1 such that the filter circuit 1 operates as a filter. The resistance values of the first and second variable resistors 5d and 5g of the integrator 5 at this point are kept at the values having been adjusted in adjustment mode M1. In other words, the phase rotation of the integrator 5 at the pole frequency is set at 90°.

As in the first embodiment, in normal operation mode M2, differential signals to be filtered are inputted to the filter circuit 1 through first and second input terminals 1a and 1b, and then the filter circuit 1 outputs the filtered differential signals through the first and second output terminals 1c and 1d.

As described above, in adjustment mode M1, the Q factor of the filter circuit 1 is adjusted to the ideal value. Thus the filter circuit 1 can perform desired filtering as designed.

Moreover, as described above, the number of resistors driven by the amplifier 5a is the same both in the case where the filter circuit 1 is operated as an integrator and in the case where the filter circuit 1 is operated as a filter. Thus the phase of the integrator and the Q factor of the filter correspond to each other with high accuracy, so that the Q factor can be more correctly adjusted.

As described above, the filter adjusting circuit 100 of the present embodiment can automatically adjust the characteristics of the filter circuit 1 operating as a first-order filter.

Fifth Embodiment

The second embodiment described an example of the configuration of a second-order filter circuit applied to a filter adjusting circuit.

The present embodiment will describe another structural example of a second-order filter circuit applied to the filter adjusting circuit.

Figure 12:
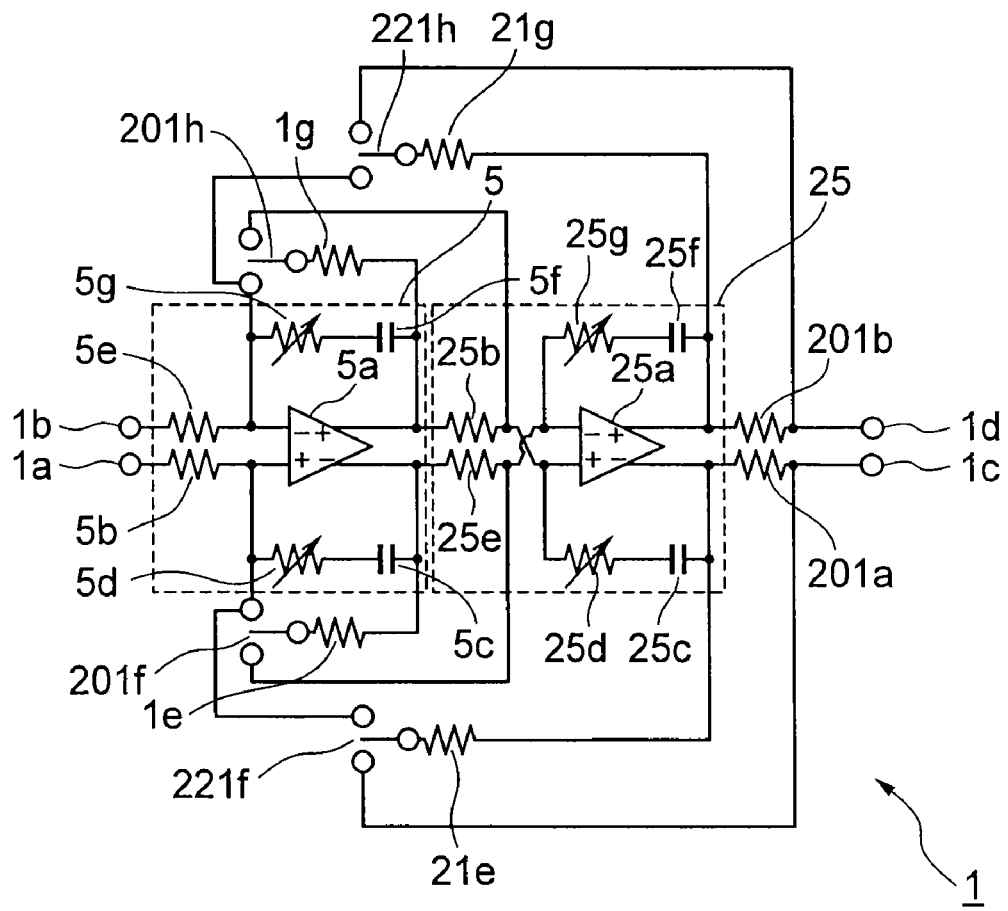
FIG. 12 is a circuit diagram showing another example of a main configuration when the filter circuit 1 of FIG. 1 is a second-order filter.
Figure 13:
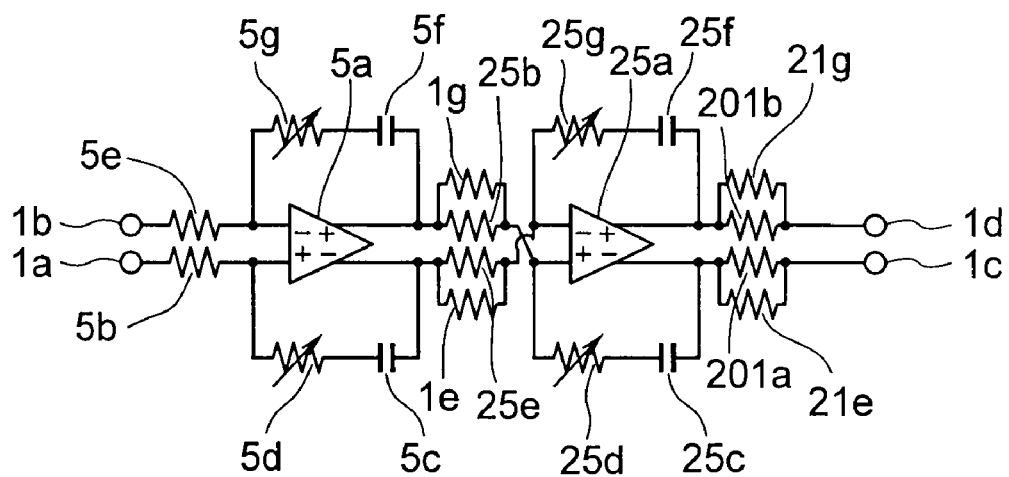
FIG. 13 is a circuit diagram showing an equivalent circuit of the filter circuit 1 when the circuit configuration of the filter circuit 1 of FIG. 12 is switched to operate as an integrator.

FIG. 12 is a circuit diagram showing another example of a main configuration when the filter circuit 1 of FIG. 1 is a second-order filter. FIG. 13 is a circuit diagram showing an equivalent circuit of the filter circuit 1 when the circuit configuration of the filter circuit 1 of FIG. 12 is switched to operate as an integrator.

Configurations indicated by the same reference numerals as in the first, second, and fourth embodiments are similar to the configurations of the first, second, and fourth embodiments. The filter circuit 1 of the fifth embodiment is applied to, like the filter circuit 1 of the first embodiment, the filter adjusting circuit 100 of FIG. 1.

As shown in FIG. 12, the filter circuit 1 further includes, unlike the second embodiment, a first output-terminal resistor 201a and a second output-terminal resistor 201b. Moreover, first switch elements 201f and 221f and second switch elements 201h and 221h have different connection relationships from the switch elements of the second embodiment. Amplifiers 5a and 25a are similar in configuration to the amplifiers of the second embodiment.

The first output-terminal resistor 201a has one end connected to the inverting output terminal of the amplifier 25a and the other end connected to a first output terminal 1c.

The second output-terminal resistor 201b has one end connected to the non-inverting output terminal of the amplifier 25a and the other end connected to a second output terminal 1d.

The resistance value of the first output-terminal resistor 201a and the resistance value of the second output-terminal resistor 201b are designed to be equal to each other.

The first switch element 201f is connected between the non-inverting input terminal of the amplifier 5a and a third resistor 1e. The first switch element 201f is also connected to a second resistor 25e (the inverting input terminal of the amplifier 25a).

When the filter circuit 1 is operated as a filter, the third resistor 1e is switched to be connected to the non-inverting input terminal of the amplifier 5a by switching the first switch element 201f. When the filter circuit 1 is operated as an integrator, the third resistor 1e is switched to be connected in parallel with the second resistor 25e by switching the first switch element 201f.

The second switch element 201h is connected between the inverting input terminal of the amplifier 5a and a fourth resistor 1g. The second switch element 201h is also connected to a first resistor 25b (the non-inverting input terminal of the amplifier 25a).

When the filter circuit 1 is operated as a filter, the fourth resistor 1g is switched to be connected to the inverting input terminal of the amplifier 5a by switching the second switch element 201h. When the filter circuit 1 is operated as an integrator, the fourth resistor 1g is switched to be connected in parallel with the first resistor 25b by switching the second switch element 201h.

The first switch element 221f is connected between the non-inverting input terminal of the amplifier 5a and a third resistor 21e. The first switch element 221f is also connected to the other end of the first output-terminal resistor 201a.

When the filter circuit 1 is operated as a filter, the third resistor 21e is switched to be connected to the non-inverting input terminal of the amplifier 5a by switching the first switch element 221f. When the filter circuit 1 is operated as an integrator, the third resistor 21e is switched to be connected in parallel with the first output-terminal resistor 201a by switching the first switch element 221f.

The second switch element 221h is connected between the inverting input terminal of the amplifier 5a and the fourth resistor 1g. The second switch element 221h is also connected to the other end of the second output-terminal resistor 201b.

When the filter circuit 1 is operated as a filter, the fourth resistor 1g is switched to be connected to the inverting input terminal of the amplifier 5a by switching the second switch element 221h. When the filter circuit 1 is operated as an integrator, the fourth resistor 1g is switched to be connected in parallel with the second output-terminal resistor 201b by switching the second switch element 221h.

The first to fourth resistors, the first and second output-terminal resistors, and first and second capacitors are set according to a target cutoff frequency and a target Q factor of the filter circuit 1.

The phase rotations of integrators 5 and 25 are controlled by adjusting the resistance values of first and second variable resistors through a control circuit 4. Further, the Q factor is adjusted by adjusting the resistance values of the first and second variable resistors.

The first switch elements 201f and 221f and the second switch elements 201h and 221h are made up of, for example, MOS transistors.

As described above, the circuit configuration of the filter circuit 1 is switched by switching the first and second switch elements. Thus the filter circuit 1 operates as a second-order integrator (FIG. 13). As shown in FIGS. 12 and 13, the number of resistors driven by the amplifier is the same both in the case where the filter circuit 1 is operated as an integrator and in the case where the filter circuit 1 is operated as a filter.

The following will describe an operation for controlling the filter circuit 1 configured thus. In the following explanation, the phase of a second signal S2 is delayed from the phase of a first signal S1 by 180° (90°×the order of 2). As in the first embodiment, the frequencies of the first and second signals S1 and S2 are set at the pole frequency of the filter circuit 1.

First, the operations of the control circuit 4 in adjustment mode M1 will be described below.

In adjustment mode M1, the control circuit 4 switches the connection of the circuit configuration of the filter circuit 1 to operate the filter circuit 1 as a circuit (in this case, including the first and second output-terminal resistors (FIG. 13)) equivalent to an integrator.

To be specific, the control circuit 4 switches the first switch element 201f and the second switch element 201h and operates the filter circuit 1 as a circuit equivalent to the integrator composing the filter, as shown in FIG. 13. In other words, the control circuit 4 switches the connection of the circuit configuration such that the resistors used for operating the filter circuit 1 as a filter in normal mode are connected in parallel with the resistors connected to the outputs of the integrators.

As in the first embodiment, when a phase comparator 3 is then fed with a third signal S3 outputted from the filter circuit 1 having operated as a circuit equivalent to an integrator, the phase comparator 3 determines whether or not the second signal S2 and the third signal S3 are in phase with each other, and then the phase comparator 3 outputs the determination result to the control circuit 4.

When receiving a determination result of a phase shift, the control circuit 4 adjusts the resistance values of first and second variable resistors 5d, 5g, 25d, and 25g of the integrators 5a and 25a, which compose the filter based on the determination result, such that the phase rotation of each of the integrators is 90°.

For example, the control circuit 4 adjusts the resistance values of the first and second variable resistors 5d and 5g based on the determination result such that the second signal S2 and the third signal S3 are in phase with each other.

The control circuit 4 at this point adjusts the resistance value of the first variable resistor such that the products of the first capacitors and the first variable resistors are equal between all the integrators 5 and 25. Further, the control circuit 4 adjusts the resistance value of the second variable resistor such that the products of the second capacitors and the second variable resistors are equal between the integrators 5 and 25. Thus the phase rotation of each of the integrators 5 and 25 is adjusted to 90°.

As described above, the phase rotation of each of the integrators is adjusted to 90° at the pole frequency, so that the Q factor is adjusted to an ideal value.

Next, the operations of the control circuit 4 in normal mode M2 will be described.

As in the first embodiment, the control circuit 4 switches the connection of the circuit configuration in a state in which the phase rotation of the first signal S1 in each of the integrators is adjusted to 90°, so that the filter circuit 1 is controlled to operate as a filter.

In other words, the control circuit 4 switches the first switch elements and the second switch elements to control the filter circuit 1 such that the filter circuit 1 operates as a filter. The resistance values of the first and second variable resistors of the integrators at this point are kept at the values having been adjusted in adjustment mode M1. In other words, the phase rotation of each of the integrators at the pole frequency is set at 90°.

As in the first embodiment, in normal operation mode M2, differential signals to be filtered are inputted to the filter circuit 1 through first and second input terminals 1a and 1b, and then the filter circuit 1 outputs the filtered differential signals through the first and second output terminals 1c and 1d.

As described above, in adjustment mode M1, the Q factor of the filter circuit 1 is adjusted to the ideal value. Thus the filter circuit 1 can perform desired filtering as designed.

Further, as described above, the number of resistors driven by the amplifier is the same both in the case where the filter circuit 1 is operated as an integrator and in the case where the filter circuit 1 is operated as a filter. Thus the phase of the integrator and the Q factor of the filter correspond to each other with high accuracy, so that the Q factor can be more correctly adjusted.

As described above, the filter adjusting circuit 100 of the present embodiment can automatically adjust the characteristics of the filter circuit 1 operating as a second-order filter.

Sixth Embodiment

The third embodiment described an example of the configuration of a third-order filter circuit applied to a filter adjusting circuit.

The present embodiment will describe another structural example of a third-order filter circuit applied to the filter adjusting circuit.

Figure 14:
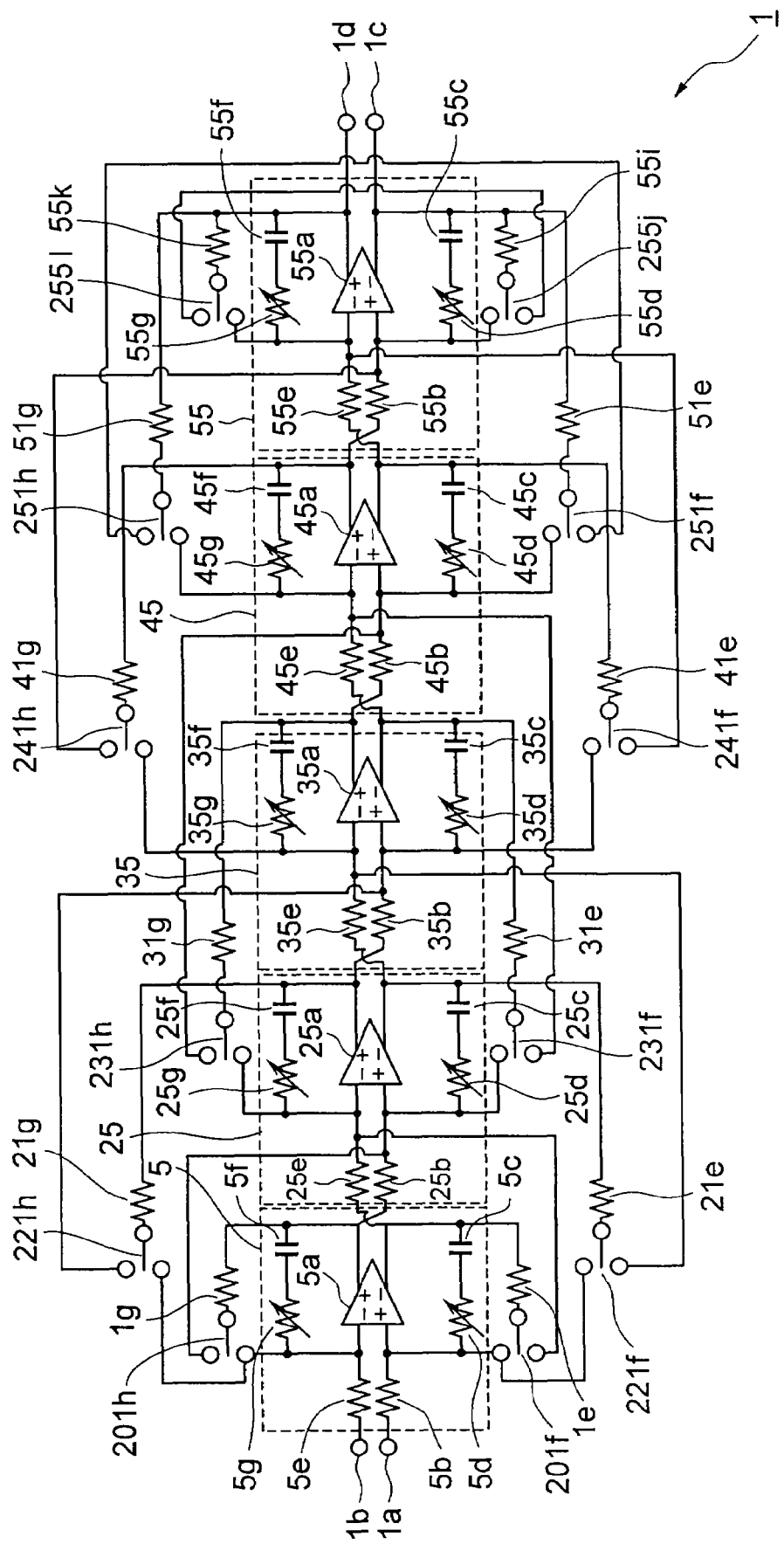
FIG. 14 is a circuit diagram showing another example of a main configuration when the filter circuit 1 of FIG. 1 is a third-order filter.
Figure 15:
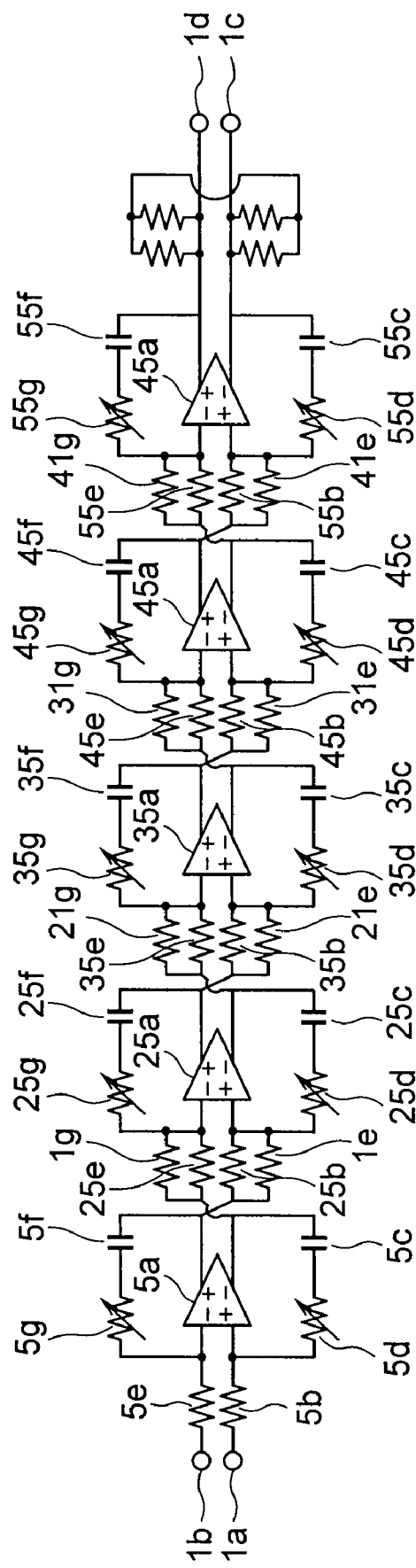
FIG. 15 is a circuit diagram showing an equivalent circuit of the filter circuit 1 when the circuit configuration of the filter circuit 1 of FIG. 14 is switched to operate as an integrator.

FIG. 14 is a circuit diagram showing another example of a main configuration when the filter circuit 1 of FIG. 1 is a third-order filter. FIG. 15 is a circuit diagram showing an equivalent circuit of the filter circuit 1 when the circuit configuration of the filter circuit 1 of FIG. 14 is switched to operate as an integrator.

Configurations indicated by the same reference numerals as in the first to fifth embodiments are similar to the configurations of the first to fifth embodiments. The filter circuit 1 of the sixth embodiment is applied to, like the filter circuit 1 of the first embodiment, the filter adjusting circuit 100 of FIG. 1.

As shown in FIG. 14, the filter circuit 1 includes first switch elements 201f, 221f, 231f, 241f and 251f, second switch elements 201h, 221h, 231h, 241h and 251h, a third switch element 255j, and a fourth switch element 255l which have different connection relationships from the switch elements of the third embodiment. Amplifiers 5a, 25a, 35a, 45a and 55a are similar in configuration to the amplifiers of the third embodiment.

The first switch element 201f is connected between the non-inverting input terminal of the amplifier 5a and a third resistor 1e. The first switch element 201f is also connected to a second resistor 25e (the inverting input terminal of the amplifier 25a).

When the filter circuit 1 is operated as a filter, the third resistor 1e is switched to be connected to the non-inverting input terminal of the amplifier 5a by switching the first switch element 201f. When the filter circuit 1 is operated as an integrator, the third resistor 1e is switched to be connected in parallel with the second resistor 25e by switching the first switch element 201f.

The second switch element 201h is connected between the inverting input terminal of the amplifier 5a and a fourth resistor 1g. The second switch element 201h is also connected to a first resistor 25b (the non-inverting input terminal of the amplifier 25a).

When the filter circuit 1 is operated as a filter, the fourth resistor 1g is switched to be connected to the inverting input terminal of the amplifier 5a by switching the second switch element 201h. When the filter circuit 1 is operated as an integrator, the fourth resistor 1g is switched to be connected in parallel with the first resistor 25b by switching the second switch element 201h.

The first switch element 221f is connected between the non-inverting input terminal of the amplifier 5a and a third resistor 21e. The first switch element 221f is also connected to a second resistor 35e (the inverting input terminal of the amplifier 35a).

When the filter circuit 1 is operated as a filter, the third resistor 21e is switched to be connected to the non-inverting input terminal of the amplifier 5a by switching the first switch element 221f. When the filter circuit 1 is operated as an integrator, the third resistor 21e is switched to be connected in parallel with the second resistor 35e by switching the first switch element 221f.

The second switch element 221h is connected between the inverting input terminal of the amplifier 5a and a fourth resistor 21g. The second switch element 221h is also connected to a first resistor 35b (the non-inverting input terminal of the amplifier 35a).

When the filter circuit 1 is operated as a filter, the fourth resistor 21g is switched to be connected to the inverting input terminal of the amplifier 5a by switching the second switch element 221h. When the filter circuit 1 is operated as an integrator, the fourth resistor 21g is switched to be connected in parallel with the first resistor 35b by switching the second switch element 221h.

The first switch element 231f is connected between the non-inverting input terminal of the amplifier 25a and a third resistor 31e. The first switch element 231f is also connected to a second resistor 45e (the inverting input terminal of the amplifier 45a).

When the filter circuit 1 is operated as a filter, the third resistor 31e is switched to be connected to the non-inverting input terminal of the amplifier 25a by switching the first switch element 231f. When the filter circuit 1 is operated as an integrator, the third resistor 31e is switched to be connected in parallel with the second resistor 45e by switching the first switch element 231f.

The second switch element 231h is connected between the inverting input terminal of the amplifier 25a and a fourth resistor 31g. The second switch element 231h is also connected to a first resistor 45b (the non-inverting input terminal of the amplifier 45a).

When the filter circuit 1 is operated as a filter, the fourth resistor 31g is switched to be connected to the inverting input terminal of the amplifier 5a by switching the second switch element 231h. When the filter circuit 1 is operated as an integrator, the fourth resistor 31g is switched to be connected in parallel with the first resistor 45b by switching the second switch element 231h.

The first switch element 241f is connected between the non-inverting input terminal of the amplifier 35a and a third resistor 41e. The first switch element 241f is also connected to a second resistor 55e (the inverting input terminal of the amplifier 55a).

When the filter circuit 1 is operated as a filter, the third resistor 41e is switched to be connected to the non-inverting input terminal of the amplifier 35a by switching the first switch element 241f. When the filter circuit 1 is operated as an integrator, the third resistor 41e is switched to be connected in parallel with the second resistor 55e by switching the first switch element 241f.

The second switch element 241h is connected between the inverting input terminal of the amplifier 35a and a fourth resistor 41g. The second switch element 241h is also connected to a first resistor 55b (the non-inverting input terminal of the amplifier 55a).

When the filter circuit 1 is operated as a filter, the fourth resistor 41g is switched to be connected to the inverting input terminal of the amplifier 35a by switching the second switch element 241h. When the filter circuit 1 is operated as an integrator, the fourth resistor 41g is switched to be connected in parallel with the first resistor 55b by switching the second switch element 241h.

The first switch element 251f is connected between the non-inverting input terminal of the amplifier 45a and a third resistor 51e. The first switch element 251f is also connected to the second switch element 251h.

When the filter circuit 1 is operated as a filter, the third resistor 51e is switched to be connected to the non-inverting input terminal of the amplifier 45a by switching the first switch element 251f. When the filter circuit 1 is operated as an integrator, the third resistor 51e is switched to be connected to the second switch element 251h by switching the first switch element 251f.

The second switch element 251h is connected between the inverting input terminal of the amplifier 45a and a fourth resistor 51g.

When the filter circuit 1 is operated as a filter, the fourth resistor 51g is switched to be connected to the inverting input terminal of the amplifier 45a by switching the second switch element 251h. When the filter circuit 1 is operated as an integrator, the fourth resistor 51g is switched to be connected to the third resistor 51e via the first switch element 251f by switching the second switch element 251h.

The third switch element 255j is connected between the non-inverting input terminal of the amplifier 55a and a fifth resistor 55i. The third switch element 255j is also connected to the fourth switch element 255l.

When the filter circuit 1 is operated as a filter, the fifth resistor 55i is switched to be connected to the non-inverting input terminal of the amplifier 55a by switching the third switch element 255j. When the filter circuit 1 is operated as an integrator, the fifth resistor 55i is switched to be connected to the fourth switch element 255l by switching the third switch element 255j.

The fourth switch element 255l is connected between the inverting input terminal of the amplifier 55a and a sixth resistor 55k.

When the filter circuit 1 is operated as a filter, the sixth resistor 55k is switched to be connected to the inverting input terminal of the amplifier 55a by switching the fourth switch element 255l. When the filter circuit 1 is operated as an integrator, the sixth resistor 55k is switched to be connected to the fifth resistor 55i via the third switch element 255j by switching the fourth switch element 255l.

The first to sixth resistors and first and second capacitors are set according to a target cutoff frequency and a target Q factor of the filter circuit 1.

The phase rotations of the integrators are controlled by adjusting the resistance values of first and second variable resistors through a control circuit 4. Further, the Q factor is adjusted by adjusting the resistance values of the first and second variable resistors.

The first to fourth switch elements are made up of, for example, MOS transistors.

As described above, the circuit configuration of the filter circuit 1 is switched by switching the first to fourth switch elements. Thus the filter circuit 1 operates as a fifth-order integrator (FIG. 15). As shown in FIGS. 14 and 15, the number of resistors driven by the amplifiers is the same both in the case where the filter circuit 1 is operated as an integrator and in the case where the filter circuit 1 is operated as a filter.

The following will describe an operation for controlling the filter circuit 1 configured thus. In the following explanation, the phase of a second signal S2 is delayed from the phase of a first signal S1 by 450° (90°×the order of 5). As in the third embodiment, the frequencies of the first and second signals S1 and S2 are set at the maximum pole frequency of the filter circuit 1.

First, the operations of the control circuit 4 in adjustment mode M1 will be described below.

In adjustment mode M1, the control circuit 4 switches the connection of the circuit configuration of the filter circuit 1 to operate the filter circuit 1 as a circuit (in this case, including the first and second output-terminal resistors (FIG. 15)) equivalent to an integrator.

To be specific, the control circuit 4 switches the first to fourth switch elements and operates the filter circuit 1 as a circuit equivalent to the integrators composing the filter, as shown in FIG. 15. In other words, the control circuit 4 switches the connection of the circuit configuration such that the resistors used for operating the filter circuit 1 as a filter in normal mode are connected in parallel with the resistors connected to the outputs of the integrators.

As in the first embodiment, when a phase comparator 3 is then fed with a third signal S3 outputted from the filter circuit 1 having operated as a circuit equivalent to the integrators, the phase comparator 3 determines whether or not the second signal S2 and the third signal S3 are in phase with each other, and then the phase comparator 3 outputs the determination result to the control circuit 4.

When receiving a determination result of a phase shift, the control circuit 4 adjusts the resistance values of first and second variable resistors of the integrators, which compose the filter, based on the determination result such that the phase rotation of each of the integrators is 90°.

For example, the control circuit 4 adjusts the resistance values of the first and second variable resistors based on the determination result such that the second signal S2 and the third signal S3 are in phase with each other.

The control circuit 4 at this point adjusts the resistance value of the first variable resistor such that the products of the first capacitors and the first variable resistors are equal among all the integrators. Further, the control circuit 4 adjusts the resistance value of the second variable resistor such that the products of the second capacitors and the second variable resistors are equal among the integrators. Thus the phase rotation of each of the integrators is adjusted to 90°.

As described above, the phase rotation of each of the integrators is adjusted to 90° at the maximum pole frequency, so that the Q factor is adjusted to an ideal value.

Next, the operations of the control circuit 4 in normal mode M2 will be described.

As in the first embodiment, the control circuit 4 switches the connection of the circuit configuration in a state in which the phase rotation of the first signal S1 is adjusted to 90° in each of the integrators, so that the filter circuit 1 is controlled to operate as a filter.

In other words, the control circuit 4 switches the first to fourth switch elements to control the filter circuit 1 such that the filter circuit 1 operates as a filter. The resistance values of the first and second variable resistors of the integrators at this point are kept at the values having been adjusted in adjustment mode M1. In other words, the phase rotation of each of the integrators at the maximum pole frequency is set at 90°.

As in the first embodiment, in normal operation mode M2, differential signals to be filtered are inputted to the filter circuit 1 through first and second input terminals 1a and 1b, and then the filter circuit 1 outputs the filtered differential signals through first and second output terminals 1c and 1d.

As described above, in adjustment mode M1, the Q factor of the filter circuit 1 is adjusted to the ideal value. Thus the filter circuit 1 can perform desired filtering as designed.

Further, as described above, the number of resistors driven by the amplifier is the same both in the case where the filter circuit 1 is operated as an integrator and in the case where the filter circuit 1 is operated as a filter. Thus the phases of the integrators and the Q factor of the filter correspond to each other with high accuracy, so that the Q factor can be more correctly adjusted.

As described above, the filter adjusting circuit 100 of the present embodiment can automatically adjust the characteristics of the filter circuit 1 operating as a fifth-order filter.

The foregoing embodiments described the filter circuits operating as first-order, second-order, and fifth-order filters. Filter circuits of other orders are similarly applicable to the filter adjusting circuit of FIG. 1.

Further, the foregoing embodiments described examples of n-th filter circuits, each including n integrators. Any filter circuit is similarly applicable to the filter adjusting circuit of FIG. 1 as long as the circuit configuration of the filter circuit can be switched to be operated as an integrator.

What is claimed is:

1. A filter adjusting circuit, comprising:
a filter circuit which has a circuit configuration operating as an n-th order filter including n (n≧1) integrators and can switch a connection of the circuit configuration to operate as a circuit equivalent to the n integrators;
a signal generating circuit that outputs a first signal having a predetermined reference frequency to the filter circuit, and outputs a second signal having the reference frequency;
a phase comparator that compares a phase of a third signal and a phase of the second signal and determines a phase shift between the signals, the third signal being obtained by processing the first signal in the filter circuit and outputted from the filter circuit; and
a control circuit that switches, in an adjustment mode for adjusting characteristics of the filter circuit, the connection of the circuit configuration to operate the filter circuit as a circuit equivalent to the integrators and adjusts the integrators composing the filter based on a determination result of the phase comparator such that a phase rotation of the first signal is 90° in each of the integrators, and switches, in a normal mode for normally operating the filter circuit after the adjustment mode, the connection of the circuit configuration in a state in which the phase rotation of the first signal is 90° in each of the integrators and controls the filter circuit to operate the filter circuit as the filter.

2. The filter adjusting circuit according to claim 1, wherein the second signal is designed to have a phase delay of 90n° (90°×the order of n) from the first signal.

3. The filter adjusting circuit according to claim 1, wherein the reference frequency is a pole frequency of the filter circuit.

4. The filter adjusting circuit according to claim 3, wherein the second signal is designed to have a phase delay of 90n° (90°×the order of n) from the first signal.

5. The filter adjusting circuit according to claim 1, wherein the control circuit switches, in the adjustment mode, the connection of the circuit configuration such that the resistors used for operating the filter circuit as the filter in the normal mode are connected in parallel with the resistors connected to outputs of the integrators.

6. The filter adjusting circuit according to claim 5, wherein the second signal is designed to have a phase delay of 90n° (90°×the order of n) from the first signal.

7. The filter adjusting circuit according to claim 1, wherein the integrator comprises:
   an amplifier;
   a first resistor connected to a non-inverting input terminal of the amplifier and fed with a signal;
   a first capacitor connected between the non-inverting input terminal and an inverting output terminal of the amplifier;
   a first variable resistor connected in series with the first capacitor between the non-inverting input terminal and the inverting output terminal;
   a second resistor connected to an inverting input terminal of the amplifier and fed with a signal;
   a second capacitor connected between the inverting input terminal and a non-inverting output terminal of the amplifier; and
   a second variable resistor connected in series with the second capacitor between the inverting input terminal and the non-inverting output terminal,
   wherein the control circuit switches, in the adjustment mode, the connection of the circuit configuration to operate the filter circuit as a circuit equivalent to the integrators composing the filter and adjusts resistance values of the first variable resistor and the second variable resistor based on the determination result of the phase comparator such that the phase rotation of the first signal is 90° in each of the integrators, and
   the control circuit switches, in the normal mode, the connection of the circuit configuration to control the filter circuit such that the filter circuit operates as the filter.

8. The filter adjusting circuit according to claim 7, wherein the second signal is designed to have a phase delay of 90n° (90°×the order of n) from the first signal.

9. The filter adjusting circuit according to claim 7, wherein the reference frequency is a pole frequency of the filter circuit.

10. The filter adjusting circuit according to claim 9, wherein the second signal is designed to have a phase delay of 90n° (90°×the order of n) from the first signal.

11. The filter adjusting circuit according to claim 7, wherein the control circuit adjusts the resistance values of the first variable resistor and the second variable resistor such that products of the first capacitors and the first variable resistors are equal and products of the second capacitors and the second variable resistors are equal among all the integrators.

12. The filter adjusting circuit according to claim 11, wherein the second signal is designed to have a phase delay of 90n° (90°×the order of n) from the first signal.

13. The filter adjusting circuit according to claim 7, wherein a capacitance value of the first capacitor and a capacitance value of the second capacitor are designed to be equal to each other.

14. The filter adjusting circuit according to claim 13, wherein the second signal is designed to have a phase delay of 90n° (90°×the order of n) from the first signal.

15. The filter adjusting circuit according to claim 7, wherein a resistance value of the first resistor and a resistance value of the second resistor are designed to be equal to each other.

16. The filter adjusting circuit according to claim 15, wherein the second signal is designed to have a phase delay of 90n° (90°×the order of n) from the first signal.

17. The filter adjusting circuit according to claim 7, wherein the filter circuit comprises:
   a third resistor connected in parallel with the first capacitor and the first variable resistor between the non-inverting input terminal and the inverting output terminal of the amplifier;
   a first switch element connected in series with the third resistor between the non-inverting input terminal and the inverting output terminal of the amplifier;
   a fourth resistor connected in parallel with the second capacitor and the second variable resistor between the inverting input terminal and the non-inverting output terminal of the amplifier; and
   a second switch element connected in series with the fourth resistor between the inverting input terminal and the non-inverting output terminal of the amplifier,
   wherein the control circuit turns off, in the adjustment mode, the first switch element and the second switch element to operate the filter circuit as a circuit equivalent to the integrators composing the filter, and adjusts the resistance values of the first variable resistor and the second variable resistor based on the determination result of the phase comparator such that the phase rotation of the first signal is 90° in each of the integrators, and
   the control circuit turns on, in the normal mode, the first switch element and the second switch element to control the filter circuit such that the filter circuit operates as the filter.

18. The filter adjusting circuit according to claim 17, wherein the second signal is designed to have a phase delay of 90n° (90°×the order of n) from the first signal.

19. The filter adjusting circuit according to claim 17, wherein the first switch element and the second switch element are MOS transistors.

20. The filter adjusting circuit according to claim 19, wherein the second signal is designed to have a phase delay of 90n° (90°×the order of n) from the first signal.

* * * * *